US007155180B2

(12) United States Patent
Kim et al.

(10) Patent No.: US 7,155,180 B2
(45) Date of Patent: Dec. 26, 2006

(54) MIXER CIRCUIT WITH SPURIOUS REJECTION BY USING MISMATCH COMPENSATION

(75) Inventors: Youngjin Kim, Seongnam-si (KR); Kwyro Lee, Daejon (KR)

(73) Assignee: Integrant Technologies Inc., Kyeongki-do (KR)

( * ) Notice: Subject to any disclaimer, the term of this patent is extended or adjusted under 35 U.S.C. 154(b) by 332 days.

(21) Appl. No.: 10/349,914

(22) Filed: Jan. 24, 2003

(65) Prior Publication Data

US 2003/0143966 A1     Jul. 31, 2003

(30) Foreign Application Priority Data

Jan. 25, 2002    (KR)   .................... 10-2002-0004523

(51) Int. Cl.
    *H04Q 7/00*      (2006.01)
(52) U.S. Cl. ............... 455/114.2; 455/63.1; 455/67.13; 455/126
(58) Field of Classification Search ............... 455/63.1, 455/67.11, 67.13, 91, 114.1, 114.2, 114.3, 455/115.1, 110, 126, 127.1, 209, 214; 375/296, 375/295, 297; 327/113, 127
See application file for complete search history.

(56) References Cited

U.S. PATENT DOCUMENTS

| | | | | |
|---|---|---|---|---|
| 5,748,678 | A * | 5/1998 | Valentine et al. | 375/296 |
| 6,032,028 | A * | 2/2000 | Dickey et al. | 455/110 |
| 6,449,465 | B1 * | 9/2002 | Gailus et al. | 455/126 |
| 6,704,551 | B1 * | 3/2004 | Riou et al. | 455/115.1 |
| 6,892,060 | B1 * | 5/2005 | Zheng | 455/63.1 |

* cited by examiner

*Primary Examiner*—Quochien B. Vuong
(74) *Attorney, Agent, or Firm*—Global IP Counselors, LLP

(57) ABSTRACT

A mixer circuit with improving characteristic of image rejection by compensating mismatch in a spurious rejection mixer circuit (SRM) used in a transmitter is provided. The mixer circuit according to the present invention comprises an up conversion unit for modulating a base-band input signal to a RF signal, a down conversion unit for converting an output signal from the up conversion unit to a base-band output signal, mismatch estimating means for determining a mismatch compensation value by which spurious component in an output signal from the down conversion unit is minimized, wherein the spurious component results from mismatch in the up conversion unit, and mismatch compensating means for compensating the mismatch in the up conversion unit by using the mismatch compensation value determined by the mismatch estimating means.

7 Claims, 13 Drawing Sheets

MIXER CIRCUIT WITH SPURIOUS REJECTION BY USING MISMATCH COMPENSATION

TECHNICAL FIELD

The present invention relates to spurious rejection mixer (SRM) circuit that rejects spurious signals, more specifically to improving characteristic of spurious rejection (SR) by using mismatch compensation circuit in SRM which is used in a transmitter.

BACKGROUND OF THE INVENTION

Generally, a mixer circuit for mixing a base-band signal with a local oscillation signal is used for generating a radio frequency (RF) signal, in a RF transmitter.

If frequencies of a base-band signal and a local oscillation signal are IF, LO, respectively, a signal that passes the mixer circuit includes frequency components of IF+LO and IF−LO.

For example, if a frequency of a signal that would be transmitted by the transmitter is IF−LO, the frequency component of IF+LO needs to be rejected. In the specification, the frequency component that would be rejected is called as spurious.

For spurious rejection, a band pass filter that only passes frequency component of IF−LO is used in an output terminal of a mixer, or a low pass filter that passes frequency components higher than IF−LO is used.

However, rejecting the frequency component of IF+LO that is not wanted to transmit perfectly is impossible, though characteristic of the band pass filter or the low pass filter is excellent. Moreover, using a filter in a transmitter is not rational, because price of a band pass filter or a low pass filter that is matched with high frequency signal is generally high.

Accordingly, a quadrature modulation mixer circuit is used as a mixer of a transmitter.

FIG. 1 shows a block diagram of a conventional quadrature modulation mixer that is used in a transmitter.

As shown in FIG. 1, an in-phase component I of a base-band signal is inputted to an in-phase input terminal of the quadrature modulation mixer, and a quadrature-phase component Q of the base-band signal whose phase is delayed from phase of the in-phase component I by 90 degree is inputted to a quadrature-phase input terminal. An in-phase and a quadrature-phase components II and QQ of a high frequency signal are generated as the in-phase and the quadrature-phase components I and Q of the base-band signal are mixed with an in-phase and a quadrature-phase components LOI and LOQ of local signal, respectively, in an in-phase mixer (101) and a quadrature-phase mixer (103). Spurious is rejected according as high frequency signals II and QQ are summed in the output terminal.

Sometimes, a quadrature modulating structure of two stages is taken for improving performance of a mixer circuit in transmitting terminal. FIG. 2 shows a block diagram of a quadrature modulating structure of two stages.

As shown in FIG. 2, a quadrature modulating mixer consists of an IF mixing unit (201) for mixing a base-band signal with a local signal LO1 having intermediate frequency, and a RF mixing unit (203) for mixing an output signal from the IF mixing unit (201) with local signal LO2 having a high frequency. Generally, a base-band signal is a digital signal, and the IF mixing unit (203) for processing the base-band signal is embodied to a digital circuit. Moreover, the output signal from the IF mixing unit (201) is converted to an analog signal by a digital to analog converter DAT. Generally, the RF mixing unit (203) that processes an intermediate frequency signal converted to an analog signal is embodied as an analog circuit.

The IF mixing unit (201) is divided into an in-phase path where the in-phase component I of the base-band signal is mixed with an in-phase and a quadrature-phase components LO1I and LO1Q of the local signal LO1 having intermediate frequency, and a quadrature-phase path where the quadrature-phase component Q of the base-band signal is mixed with the in-phase and the quadrature-phase components LO1I and LO1Q of the local signal LO1 having intermediate frequency.

The signal that passes the in-phase path of the IF mixing unit (201) comprises an in-phase and a quadrature-phase components II and IQ having intermediate frequency. Moreover, the signal that passes the quadrature-phase path of the IF mixing unit (201) comprises an in-phase and a quadrature-phase components QI and QQ having intermediate frequency.

The output signal from the IF mixing unit (201) is converted to a digital signal by a digital to analog converter. In this case, a converted analog signal of the signal that passes the in-phase path of the IF mixing unit (201) is called as an in-phase component IF-I having intermediate frequency, and a converted analog signal of the signal that passes the quadrature-phase path of the IF mixing unit (201) is called as a quadrature-phase component IF-Q having intermediate frequency.

The RF mixing unit (203) is divided into an in-phase path where the in-phase component IF-I having intermediate frequency is mixed with an in-phase component LO2I of the local signal LO2 having high frequency, and a quadrature-phase path where the quadrature-phase component IF-Q having intermediate frequency is mixed with a quadrature-phase component LO2Q of the local signal LO2 having high frequency.

The signal that passes the in-phase path of the RF mixing unit (203) comprises an in-phase component III having high frequency of the in-phase component II having intermediate frequency and an in-phase component IQI having high frequency of the quadrature-phase component IQ having intermediate frequency. Moreover, the signal that passes the quadrature-phase path of the RF mixing unit (203) comprises an quadrature-phase component QIQ having high frequency of the in-phase component QI having intermediate frequency and a quadrature-phase component QQQ having high frequency of the quadrature-phase component QQ having intermediate frequency.

Signals that pass the in-phase and the quadrature-phase paths of the RF mixing unit (203) are added with each other, and are outputted via the output terminal. The output signal is passed through a power-amplifying unit etc. and is emitted through an antenna.

However, there are many cases that spurious is not rejected fully even if the above quadrature modulating mixer circuit is used in a transmitter. There are mismatch of symmetric circuit or mismatch between in-phase and quadrature-phase signals of local signals synthesized from a frequency synthesizer, and so on, as factors of generating such spurious. In various reasons of generating spurious, the gain mismatch between mixer circuits of the in-phase path and the quadrature-phase path and the phase mismatch between the in-phase and the quadrature-phase components of the local oscillation signal are significant reasons.

SUMMARY OF THE INVENTION

The object of the present invention is to provide a quadrature modulating mixer circuit where spurious component is fully rejected.

Another object of the present invention is to provide a quadrature modulating mixer circuit where spurious component is fully rejected by compensating mismatch of inner part of a mixer circuit.

According to an aspect of the present invention, a mixer circuit comprises an up conversion unit for modulating a base-band input signal to a RF signal, a down conversion unit for converting an output signal from the up conversion unit to a base-band output signal, a mismatch estimating means for determining a mismatch compensation value by which spurious component in an output signal from the down conversion unit is minimized, wherein the spurious component results from mismatch in the up conversion unit, and a mismatch compensating means for compensating the mismatch in the up conversion unit by using the mismatch compensation value determined by the mismatch estimating means.

DETAILED DESCRIPTION

Hereinafter, preferred embodiments of the present invention will be described in detail with reference to the attached drawings.

Constitution of Entire Circuit

Figure 1:
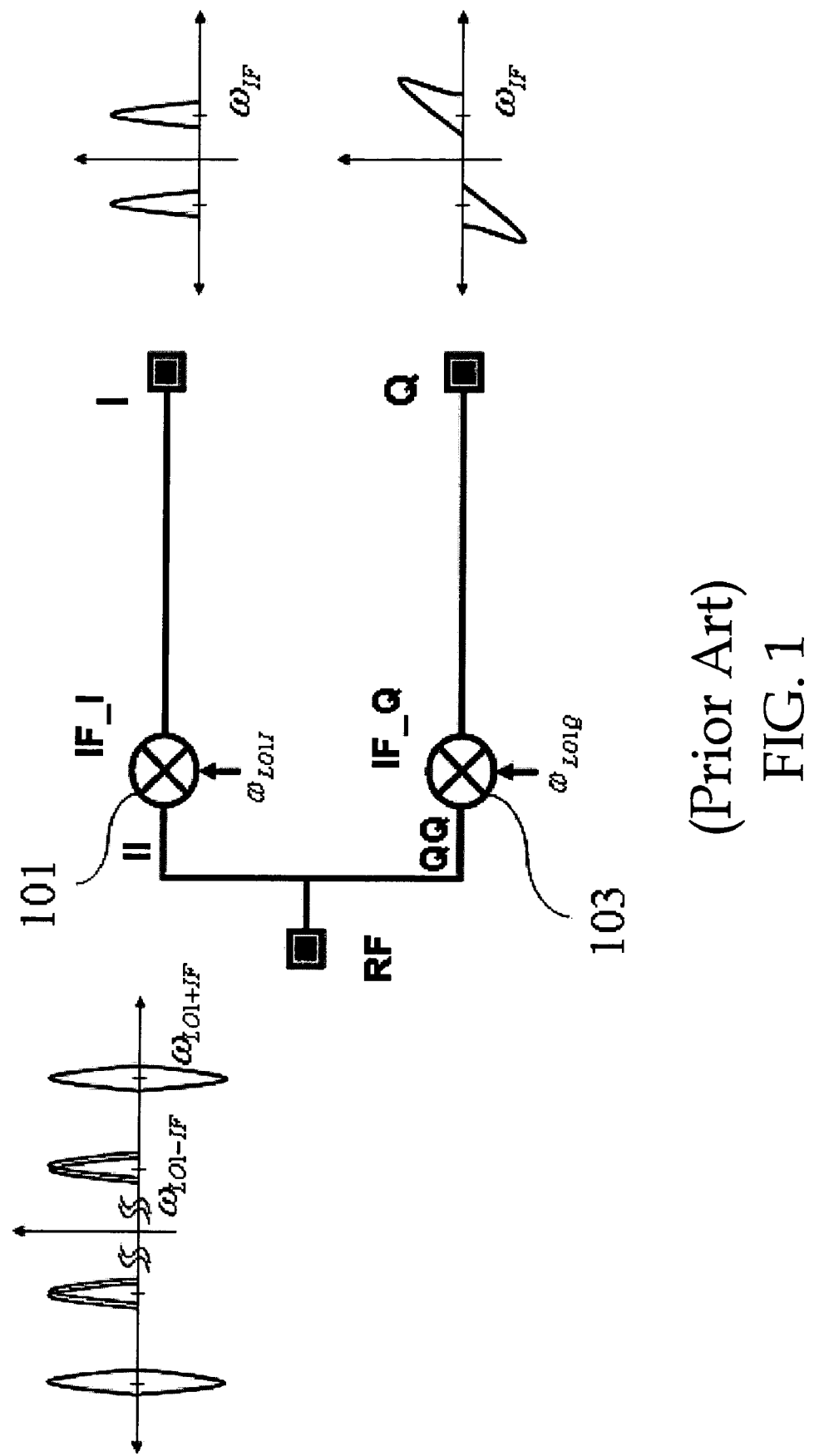
FIG. 1 shows a block diagram of an example of conventional direct conversion mixer that is used in a transmitter.
Figure 2:
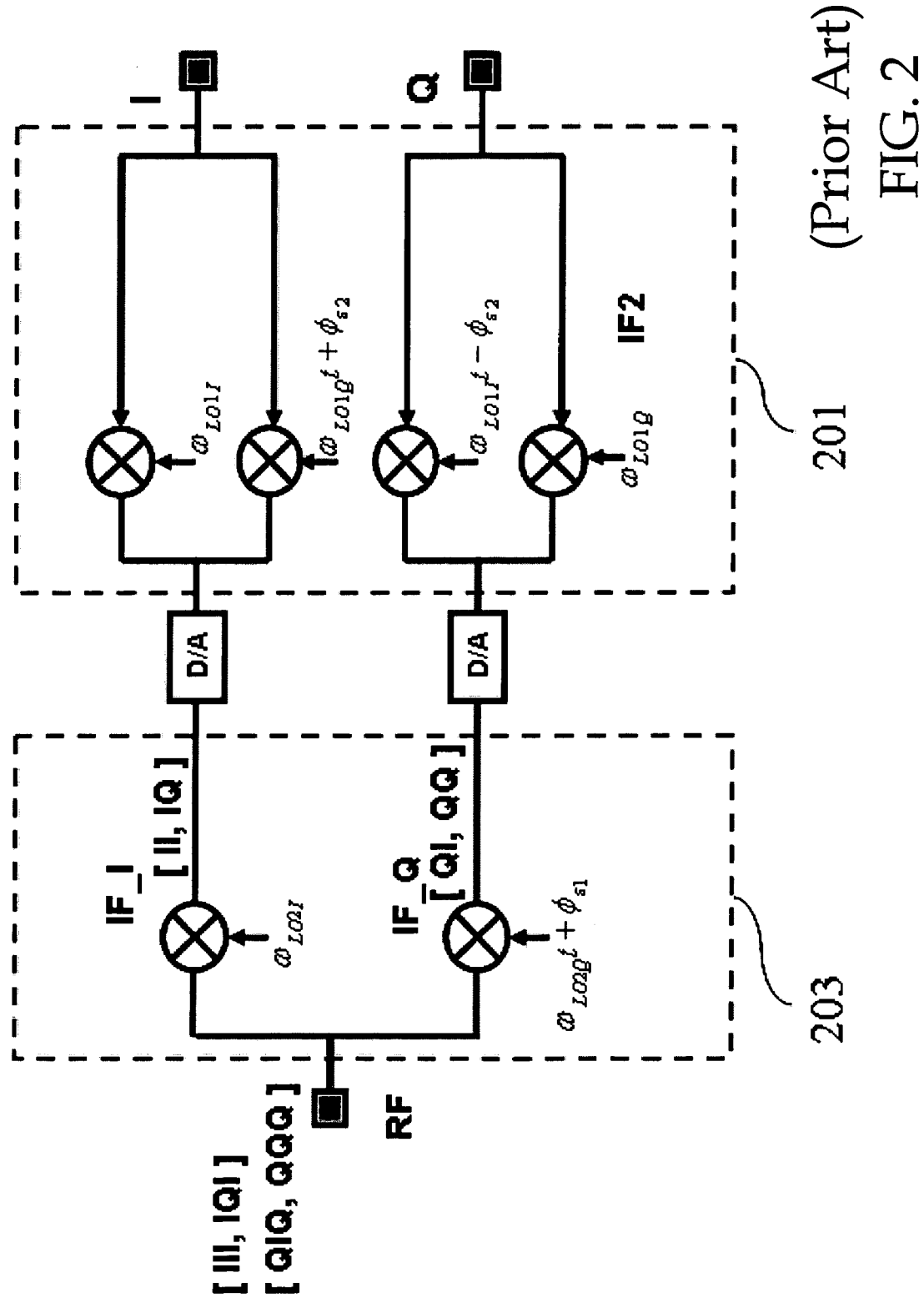
FIG. 2 shows a block diagram of a quadrature modulating structure of two stages.
Figure 3:
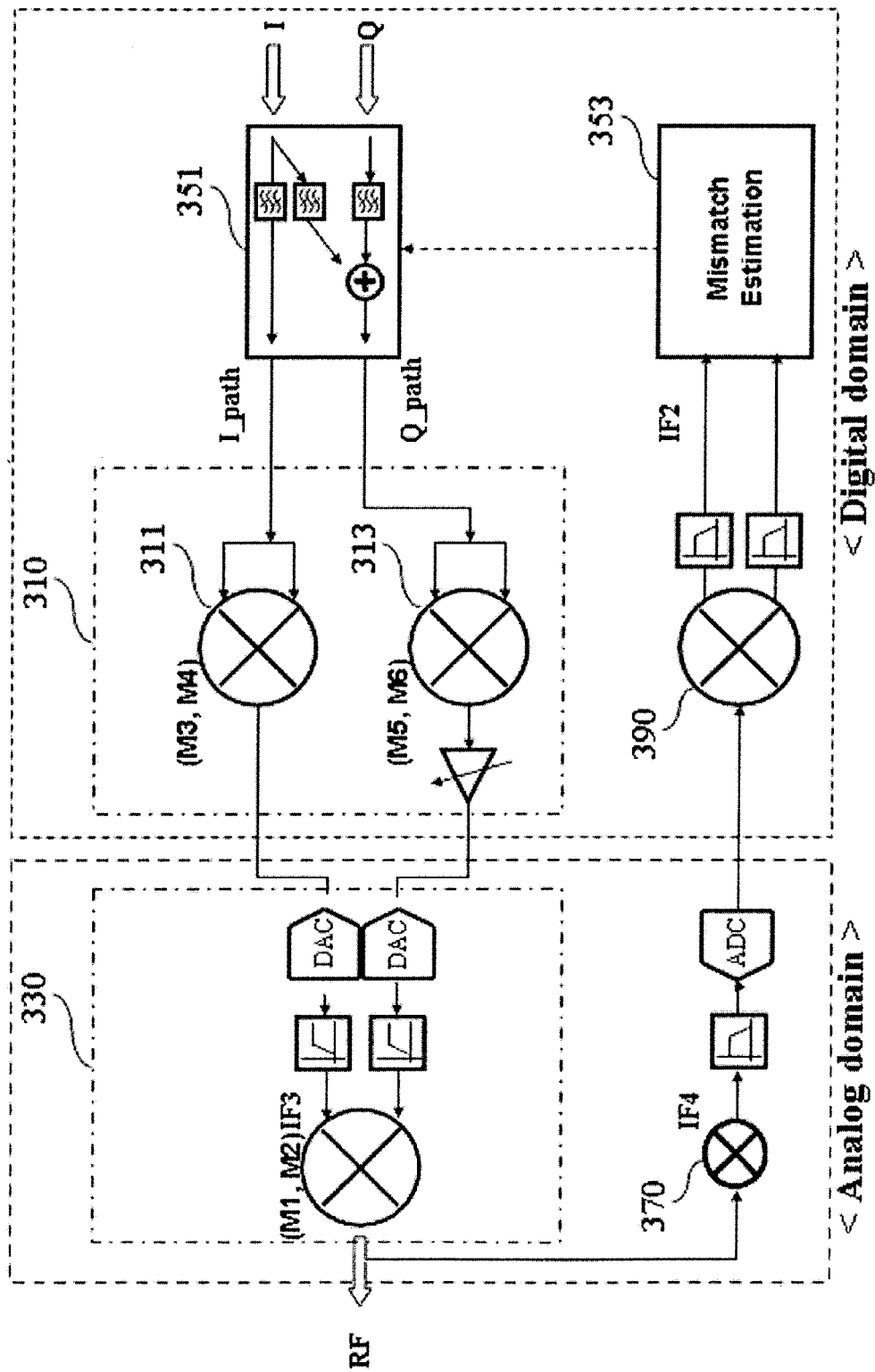
FIG. 3 shows a block diagram of an embodiment of a mixer circuit where spurious is rejected according to the present invention.

FIG. 3 shows a block diagram of an embodiment of a mixer circuit where spurious is rejected according to the present invention.

The mixer circuit according to the present invention comprises an up conversion unit for modulating a base-band input signal to a RF signal, and a down conversion unit for estimating mismatch which is generated in the up conversion unit by converting an output signal from the up conversion unit to a base-band output signal.

The up conversion unit takes charge of modulation in a transmitter where the mixer circuit according to the present invention is applied. The down conversion unit is called as a mismatch estimating means in below, because it is pertinent to a part for mismatch estimation according to the present invention. The mismatch estimating means may be a separate down conversion circuit that is provided separately in a transmitter. Preferably, a down conversion circuit of a receiver could be utilized as a mismatch estimating means in a transceiver whose configuration is a combination of transmitter and receiver. A down conversion unit or a mismatch estimating means of the specification must be interpreted as meaning that comprises above two circuits. Therefore, the idea and the scope of the present invention are not confined to the written words in the specification.

The up conversion unit according to the present invention comprises an up conversion intermediate frequency mixer group (310) for mixing a base-band input signal with the first local signal LO1 having intermediate frequency and an up conversion high frequency mixer group (330) for mixing an output signal from the up conversion intermediate frequency mixer group (310) with the second local signal LO2 having high frequency. Preferably, the base-band input signal is a digital signal, and the up conversion intermediate frequency mixer group (310) for processing the base-band input signal which is a digital signal, is embodied as a digital circuit. Moreover, the output signal from the up conversion intermediate frequency mixer group (310) is preferably converted to an analog signal by a digital to analog converter group DAC. The up conversion high frequency mixer group (330) that processes an intermediate frequency signal converted to an analog signal is preferably embodied as an analog circuit.

The up conversion intermediate frequency mixer group (310) is divided into an in-phase path I-path where the in-phase component I of the base-band input signal is mixed with an in-phase and a quadrature-phase components LO1I and LO1Q of the first local signal LO1, and a quadrature-phase path Q-path where the quadrature-phase component Q of the base-band input signal is mixed with the in-phase and the quadrature-phase components LO1I and LO1Q of the first local signal LO1.

As shown in FIG. 3, an in-phase mixer subgroup (311) of the up conversion intermediate frequency mixer group (310) is provided for mixing the in-phase component I of the base-band input signal with the in-phase and the quadrature-phase components LO1I and LO2Q of the first local signal LO1, in the in-phase path I-path. Moreover, an quadrature-phase mixer subgroup (313) of the up conversion intermediate frequency mixer group (310) is provided for mixing the quadrature-phase component Q of the base-band input signal with the in-phase and the quadrature-phase components LO1I and LO1Q of the first local signal LO1, in the quadrature-phase path Q-path. Preferably, the in-phase mixer subgroup (311) comprises in-phase and quadrature-phase mixers M3 and M4 for mixing the in-phase component I of the base-band input signal with in-phase and quadrature-phase components LO1I and LO1 Q of the first local signal LO1, respectively. Further, the quadrature-phase mixer subgroup (313) comprises in-phase and quadrature-phase mixers M5 and M6 for mixing the quadrature-phase component Q of the base-band input signal with the in-phase and the quadrature-phase components LO1I and LO1Q of the first local signal LO1, respectively. Output signals of the in-phase and the quadrature-phase mixers M3 and M4 of the in-phase mixer subgroup (311) are added and outputted. Output signals of the in-phase and the quadrature-phase mixers M5 and M6 of the quadrature-phase mixer subgroup (313) are added and outputted.

The up conversion high frequency mixer group (330) is divided into an in-phase path where an output signal from the in-phase mixer subgroup (311) of the up conversion intermediate frequency mixer group (310) is mixed with an in-phase component LO2I of the second local signal LO2 having high frequency, and a quadrature-phase path where an output signal from the quadrature-phase mixer subgroup (313) of the up conversion intermediate frequency mixer group (310) is mixed with a quadrature-phase component LO2Q of the second local signal LO2. Preferably, the up conversion high frequency mixer group (330) comprises a in-phase mixer M1 for mixing the output signal from the in-phase path I-path of the up conversion intermediate frequency mixer group (310) with the in-phase component LO2I of the second local signal LO2, and the quadrature mixer M2 for mixing the output signal of the quadrature-phase path Q-path of the up conversion intermediate frequency mixer group (310) with the quadrature-phase component LO2Q of the second local signal LO2.

The signals that pass the in-phase and the quadrature-phase path of the up conversion high frequency mixer group (330) are added to each other, and outputted via the output terminal. The output signal is passed through a power amplifying unit and so on, and is emitted via an antenna.

A mixer circuit according to the present invention, further comprises a mismatch compensating means (351) provided in the up conversion intermediate frequency mixer group. Moreover, the mixer circuit according to the present invention further comprises a mismatch estimating means (353) for estimating mismatch of the output signal from the up conversion high frequency mixer group (330).

Preferably, as shown in FIG. 3, a down conversion unit that is connected to an antenna via the output terminal of the up conversion high frequency mixer group (330) may be adopted as the mismatch estimating means. The down conversion unit comprises a down conversion intermediate frequency mixer group (370) for down converting a high frequency signal inputted from an antenna to an intermediate frequency signal, and a down conversion base-band mixer group (390) for outputting a base-band output signal by quadrature mixing the output signal from the down conversion intermediate frequency mixer group (370). The output signal from the down conversion base-band mixer group (390) comprises in-phase and quadrature-phase components. The down conversion circuit comprises the mismatch estimating means (353) that estimates mismatch from the in-phase and the quadrature-phase components of the output signal from the down conversion base-band mixer group (390). The mismatch estimating means (353) determines a mismatch compensation value from the base-band output signal so that effect of mismatch generated in the up conversion unit is minimized, by using below described method.

Preferably, the high frequency signal that is inputted to the down conversion unit is an analog signal, and the down conversion intermediate frequency mixer group (370) is embodied as an analog circuit. The output signal from the down conversion intermediate frequency mixer group (370) is converted to a digital signal by an analog to digital converter ADC. Thus, the down conversion unit has an analog domain and a digital domain. The down conversion base-band mixer group (390) that processes the intermediate frequency signal converted to a digital signal and the mismatch estimating means (353) that determines a mismatch estimation value from the output signal from the down conversion base-band mixer group (390) are embodied as a digital circuit.

The mismatch compensating means (351) may be embodied as a form of filter whose gain and phase are adjustable to a frequency. According to another embodiment of the present invention, the mismatch compensating means (351) is a filter bank whose gain and phase are adjustable to various frequencies. According to the present invention, a mismatch value of predetermined base-band output signal is estimated by the mismatch estimating means (353), and gain and phase of the mismatch compensating means (351) are adjusted on the basis of the mismatch compensation value that is determined by the mismatch estimating means (353).

The whole operation of the mixer circuit where spurious is rejected according to the present invention is described in below, with referring to FIG. 3.

In below description, a case that the gain and the phase mismatch generated in the up conversion unit of the mixer circuit are dominant is described mainly. In the embodiment that the up conversion intermediate frequency mixer group (310) is embodied as a digital circuit, and the up conversion high frequency mixer group (330) is embodied as an analog circuit, specially, the gain mismatch and the phase mismatch of the up conversion high frequency mixer group (330) which are analog circuits, are dominant.

Figure 4:
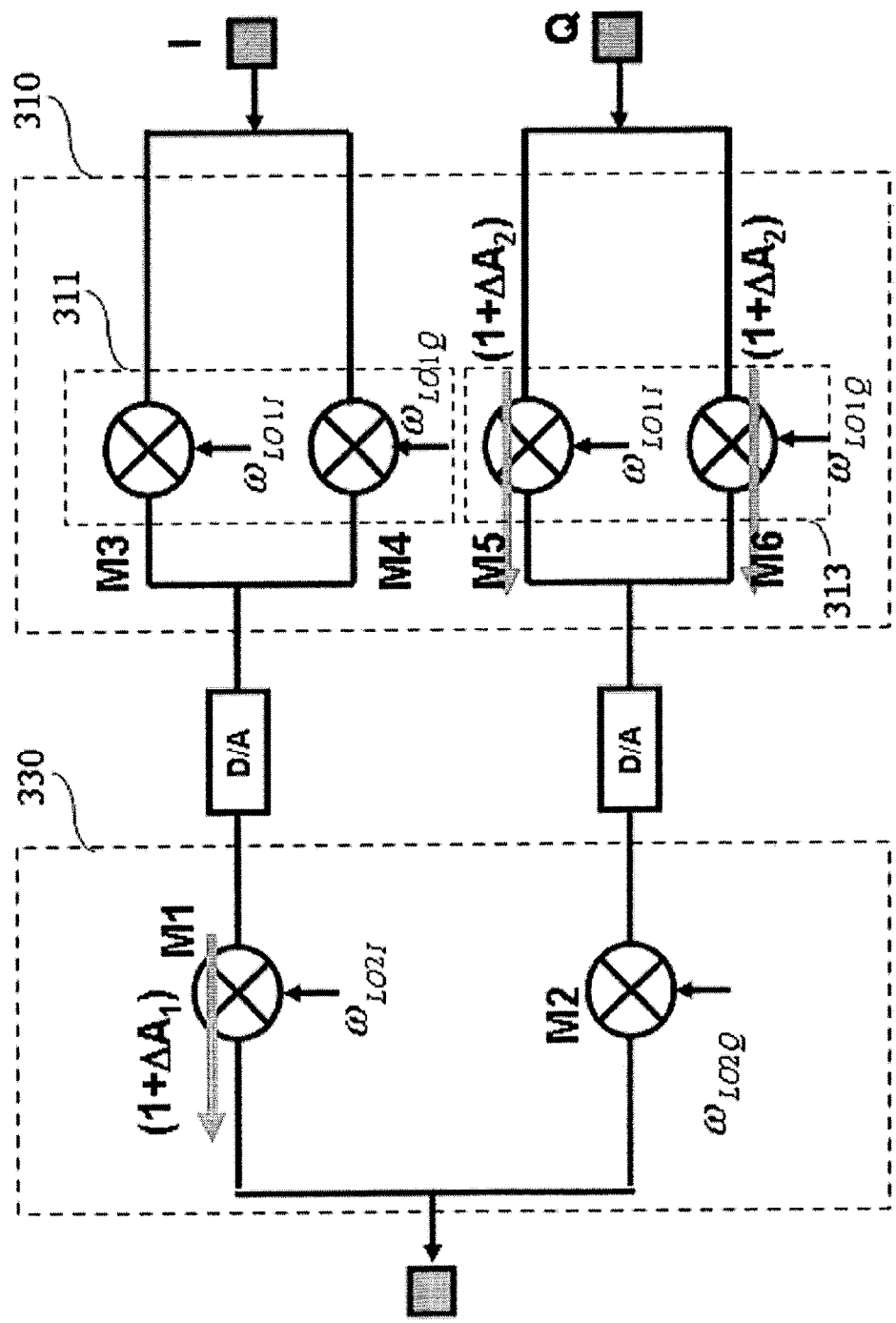
FIG. 4 shows a block diagram of up conversion unit of the mixer circuit according to the present invention that displays paths where gain mismatch is generated and the cause of generating the mismatch.
Figure 5:
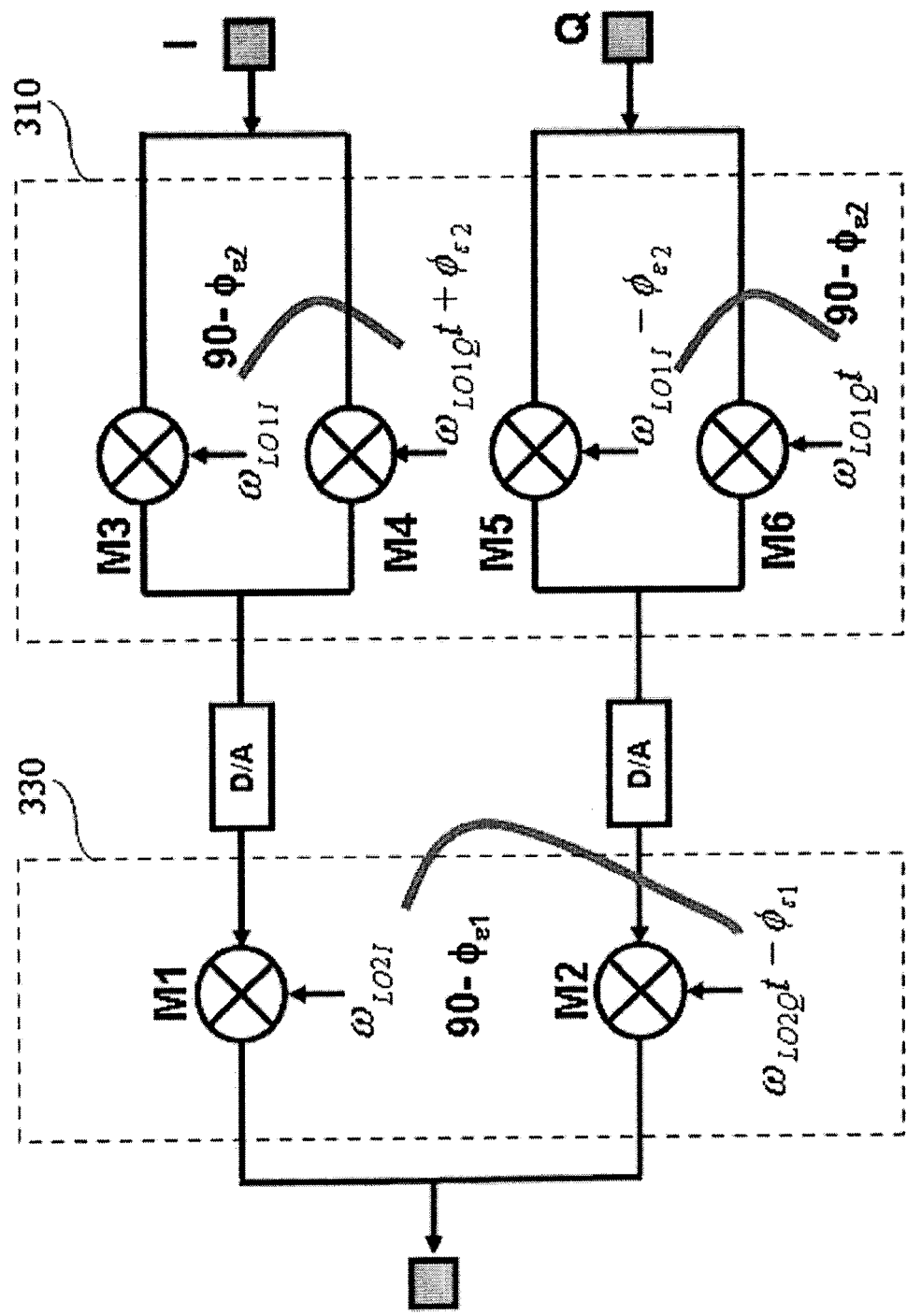
FIG. 5 shows a block diagram of up conversion unit of the mixer circuit according to the present invention that displays paths where gain mismatch and phase mismatch are generated and the cause of generating the mismatches respectively.

FIGS. 4 and 5 show a block diagram of the up conversion unit of the mixer circuit according to the present invention that display paths where the gain mismatch and the phase mismatch are generated, and causes of generating the mismatches.

When the gain mismatch A1 is generated between the in-phase and the quadrature-phase mixers M1, M2 of the up conversion high frequency mixer group (330), compensation of the gain mismatch using the gain compensation value A2 between the in-phase mixer M3 of the in-phase mixer subgroup (311) and the in-phase mixer M5 of the quadrature-phase mixer subgroup (313), or the quadrature-phase mixer M4 of the in-phase mixer subgroup (311) and the quadrature-phase mixer M6 of the quadrature-phase mixer subgroup (313), as shown FIG. 4, is illustrated as an example. Moreover, when the phase mismatch Ø1 which is larger than 90 degree is generated between the in-phase and the quadrature-phase components LO2I and LO2Q of the second local signal LO2 which is applied in the in-phase mixer M1 and the quadrature-phase mixer M2 of the up conversion high frequency mixer group (330), respectively, compensation of the phase mismatch using the phase compensation value Ø2 between the in-phase mixer M3 and the quadrature-phase mixer M4 of the in-phase mixer subgroup (311) or the in-phase mixer M5 and the quadrature-phase mixer M6 of the quadrature-phase mixer subgroup (313), as shown FIG. 5, is illustrated as an example.

Method for Estimating Mismatch

Figure 6:
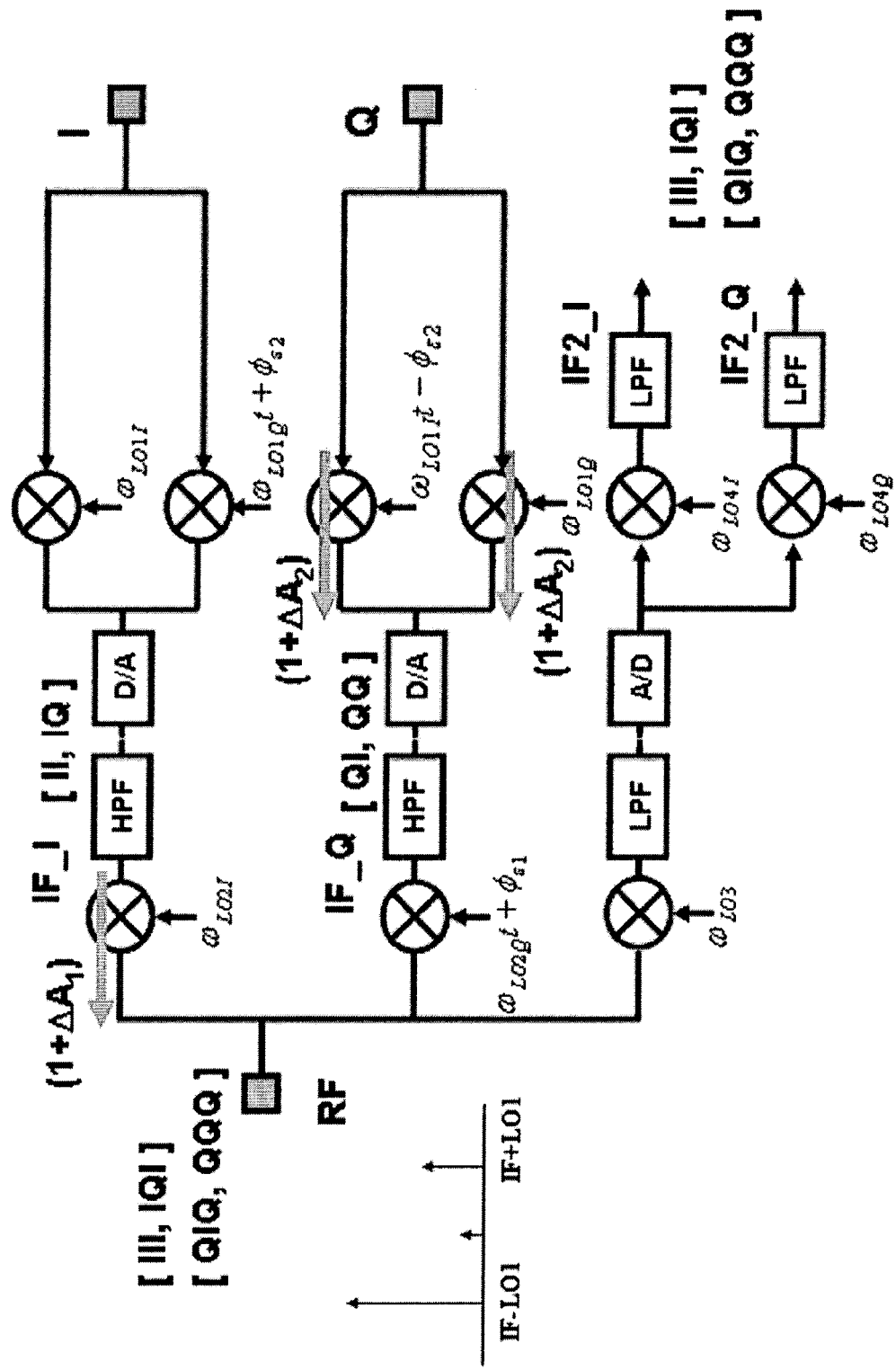
FIG. 6 shows a process of estimating mismatch of the mixer circuit according to the present invention.

First, a process for estimating mismatch is illustrated. FIG. 6 shows the process of estimating mismatch of a mixer circuit according to the present invention.

The base-band sinusoidal signal is inputted to an in-phase and a quadrature-phase input nodes I and Q of the up conversion intermediate frequency mixer group (310). The in-phase and the quadrature-phase components of the base-band input signal that is inputted to the in-phase input node I and the quadrature-phase input node Q, respectively are represented by Eqn. 1 and 2.

$$I(t)=\cos(t) \quad \text{Eqn. 1}$$

$$Q(t)=\sin(t) \quad \text{Eqn. 2}$$

Signals generated as the in-phase and the quadrature-phase components of the base-band input signal pass the up conversion intermediate mixer group (310), in other words, signals generated as signals of the node IF-I and the node IF-Q pass the high pass filter, are represented by Eqn. 3 and 4. In below, a frequency of a desired signal among signals that are mixed to intermediate frequency signals by the up conversion intermediate frequency mixer group (310) is supposed to IF1. Moreover, accurate levels of signals are omitted.

$$IF\_I = [\cos(IF1t) + \sin(IF1t + \varnothing 2)] \quad \text{Eqn. 3}$$

$$IF\_Q = [\sin(IF1t - \varnothing 2) - \cos(IF1t)] \times (1 + A2) \quad \text{Eqn. 4}$$

After signals of the node IF-I and the node IF-Q are passed to the up conversion high frequency mixer group (330), a signal of the RF terminal is represented by Eqn. 5. In below, a frequency of desired signal among signals that are mixed to a high frequency signals by the up conversion high frequency mixer group (310) is supposed to RF.

$$RF = (1 + A1) \times [\cos(RFt) + \sin(RFt + \varnothing 2)] + \quad \text{Eqn. 5}$$
$$(1 + A2) \times [-\cos(RFt + \varnothing 1 - \varnothing 2) - \sin(RFt + \varnothing 1)]$$

The output signal of the RF terminal is down converted to an intermediate frequency signal by passing the down conversion intermediate frequency mixer group (370) of the down conversion unit that is the mismatch compensating means according to the present invention. In this case, it is preferable that a frequency of the third local signal that is applied to the down conversion intermediate frequency mixer group is higher than a frequency of spurious component in output signals of the RF terminal by a frequency of the intermediate frequency signal to be down converted (High-side mixing). It is for rejecting down conversion of data signal among output signals of the RF terminal to an intermediate frequency signal.

Preferably, data components except for spurious component of the intermediate frequency signal are rejected by low pass filter. Next, the intermediate frequency signal is converted to a digital signal by an analog to digital converter ADC. The intermediate frequency signal is outputted as a base-band output signal by passing the down conversion base-band mixer group. The base-band output signal comprises an in-phase component and a quadrature-phase component.

Signals of the in-phase and the quadrature-phase output terminals IF2_I and IF2-Q of the down conversion base-band mixer group are represented by Eqn. 6 and 7 respectively.

$$IF2\_1 = (1 + A1) \times [\cos(t) + \sin(t + \varnothing 2)] + \quad \text{Eqn. 6}$$
$$(1 + A2) \times [-\cos(t + \varnothing 1 - \varnothing 2) - \sin(t + \varnothing 1)]$$

-continued $$IF2\_Q = (1 + A1) \times [\sin(t) + \cos(t + \varnothing 2)] + \quad \text{Eqn. 7}$$
$$(1 + A2) \times [-\sin(t + \varnothing 1 - \varnothing 2) - \cos(t + \varnothing 1)]$$

Signals of the in-phase and the quadrature-phase output terminals IF2-I and IF2-Q of the down conversion base-band mixer group are inputted to the mismatch estimating means. The mismatch estimating means calculates value of signals that pass the low pass filters, and squares each value of signal of IF2-I and IF2-Q, and adds the squared values. Eqn. 8 represents sum of square values of signals IF2-I and IF2-Q.

$$IF2\_I^2 + IF2\_Q^2 = (A1 - A2)^2 + (\varnothing 1 - \varnothing 2)^2 + f(2) \quad \text{Eqn. 8}$$

In Eqn. 8, the component of f(2) has twice frequency of the base-band input signal inputted to the up conversion intermediate frequency mixer group. The component of f(2) can be rejected easily by low pass filtering. The signal after low pass filtering is represented as like Eqn. 9.

$$IF2\_I^2 + IF2\_Q^2 = (A1 - A2)^2 + (\varnothing 1 - \varnothing 2)^2 \quad \text{Eqn. 9}$$

Figure 7:
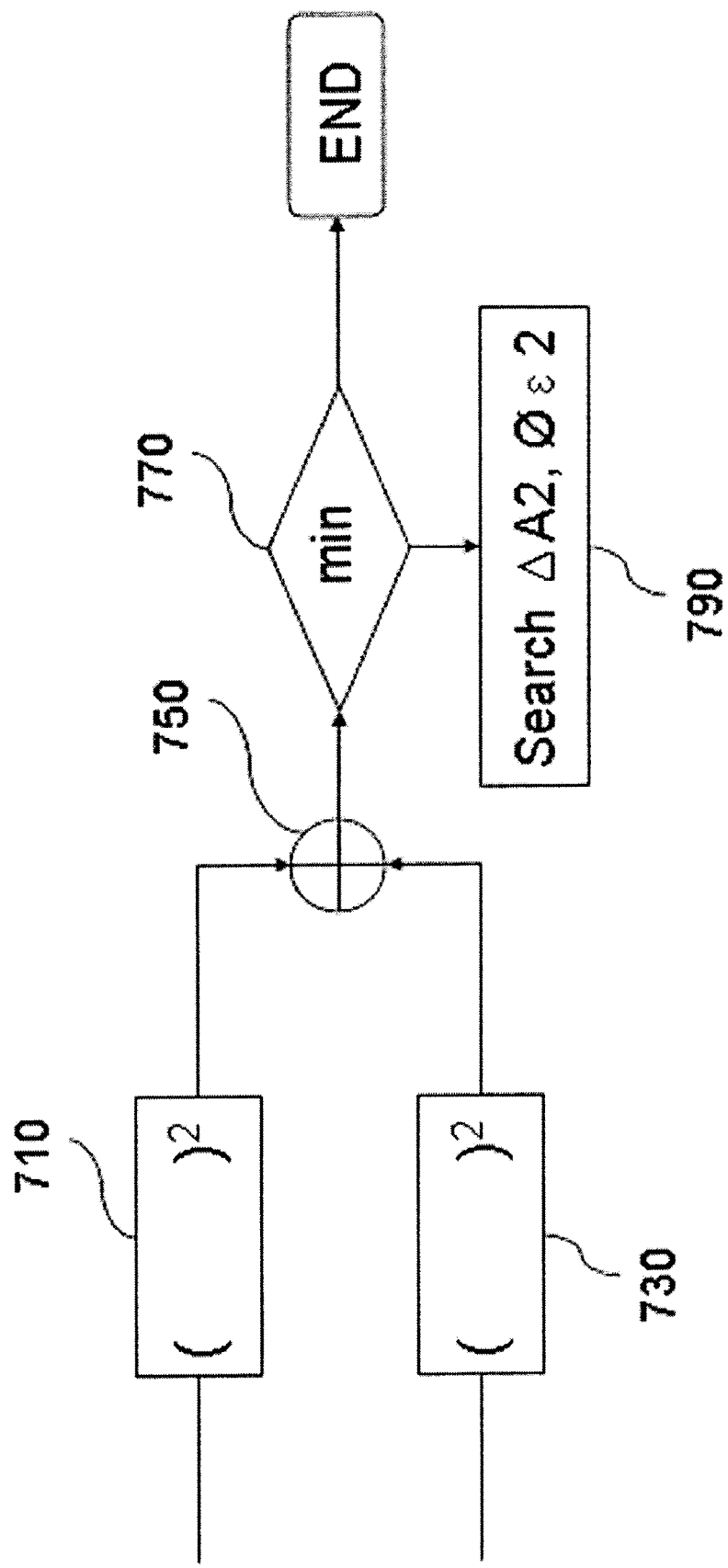
FIG. 7 shows a process of acquiring A2, Ø2 by which a calculated value is minimized.

The process for acquiring values of A2 and Ø2 by which the value calculated by Eqn. 9 is minimized is showed in FIG. 7. FIG. 7 is a block diagram of the mismatch estimating means (353) according to an embodiment of the present invention, in the circuit shown in FIG. 3. As shown in FIG. 7, an embodiment of the mismatch estimating means (353) comprises a I-path squaring unit (710) for squaring signal value I-path, a Q-path squaring unit (730) for squiring signal value Q-path, an adding unit (750) for adding output signals of the I-path squiring unit (710) and the Q-path squiring unit (730), and an estimating unit (790) for estimating the gain compensation value A2 and the phase compensation value Ø2 by which the adding signal is minimized through searching process. In embodiment shown in FIG. 7, making sum of square values of the I-path signal and the Q-path signal to be minimized is a reference. Another substitutable reference of determination can be used as well as the reference that is adopted in the embodiment in FIG. 7.

The inventor of the present invention invents the method of calculating a condition in which the mismatch is minimized by following the gain mismatch value and the phase mismatch value with varying values of A2 and Ø2, through the above process.

Method for Compensating Mismatch

As above described, the mismatch compensating means compensates signals of the in-phase path and the quadrature-phase path of the up conversion unit according to the acquired mismatch estimation value. Preferably, operation of the mismatch compensating means is performed in digital domain.

The gain mismatch A1 of the in-phase and the quadrautre-phase mixers M1 and M2 in analog domain, shown in FIG. 4, is estimated by an embodiment shown in FIG. 3, and the gain compensation value A2 for compensating the mismatch is reflected to the in-phase and the quadrature-phase mixers M5 and M6 of the quadrature-phase mixer subgroup (313) in digital domain. There are methods of adjusting gain of mixers, and compensating gain by using the mismatch compensating means provided in the up conversion intermediate frequency mixer group (310) as shown in FIG. 3, as methods for compensating the gain mismatch by using the gain compensation value A2 to the in-phase and the quadrature-phase mixers M5, M6 of the quadrature-phase mixer subgroup (313) in digital domain.

With this, effect of the gain mismatch generated in analog domain on high frequency outputs III, IQI, QIQ, and QQQ of the up conversion unit is minimized.

First, the gain compensation value A2 by which effect of the gain mismatch between the in-phase mixer M1 and the quadrature-phase mixer M2 on outputs of the down conversion base-band mixer group is minimized by Eqn. 9, is acquired, by making gains of the in-phase and the quadrature-phase mixers M5 and M6 of the quadrature-phase mixer subgroup (313) be different with gains of the in-phase and the quadrature-phase mixers M3 and M4 of the in-phase mixer subgroup (311) by a predetermined value, and determining whether sum of square values of the in-phase and the quadrature-phase components of the base-band output signal is minimized with varying the difference gradually, in digital domain.

Moreover, about the phase mismatch which is shown in FIG. 5, the phase mismatch Ø1 between the in-phase and quadrature-phase components LO2I and LO2Q of the second local signal LO2 in analog domain is estimated, and the phase compensation value Ø2 for compensating the mismatch is reflected to the frequencies of the in-phase and the quadrature-phase components LO1I and LO1Q of the first local signal LO1 in digital domain. There are methods of adjusting phase of local signal and compensating phase with using the mismatch compensating means which is provided in the up conversion intermediate frequency mixer group (310) as shown in FIG. 3, as method for compensating the mismatch by reflecting the phase compensation value Ø2 to the frequency of the in-phase and the quadrature-phase components LO2I and LO2Q of the first local signal LO1 in digital domain.

With this, effect of the phase mismatch generated in analog domain on high frequency outputs III, IQI, QIQ, and QQQ of the up conversion unit is minimized. First, the phase compensation value Ø2 by which effect of the phase mismatch which is larger than 90 degree between the in-phase and the quadrature-phase components LO2I and LO2Q of the second local signal LO2 is minimized by Eqn. 9, is acquired, by making phase difference between in-phase and the quadrature-phase components LO1I and LO1Q of the first local signal LO1 to be a predetermined value which is larger than 90 degree, and determining whether sum of square values of the in-phase and the quadrature-phase components of the base-band output signal is minimized, with varying the difference gradually, in digital domain.

The gain and the phase compensation values acquired by above method are stored in a memory, and used to compensate mismatches in the up conversion unit by the mismatch compensating means when the mixer circuit according to the present invention is operated. The process of estimating mismatches and determining the mismatch compensation values may be performed at the first time when the mixer circuit operates. In this case, the predetermined compensation values are stored in the memory and used semi-permanently. Moreover, the process of estimating mismatches and determining compensation values may be performed repeatedly during operation time of the mixer circuit. In this case, the determined compensation values are stored in the memory, and used to compensate mismatches with being renewed every time when the mismatch compensation value is determined.

Figure 8A:
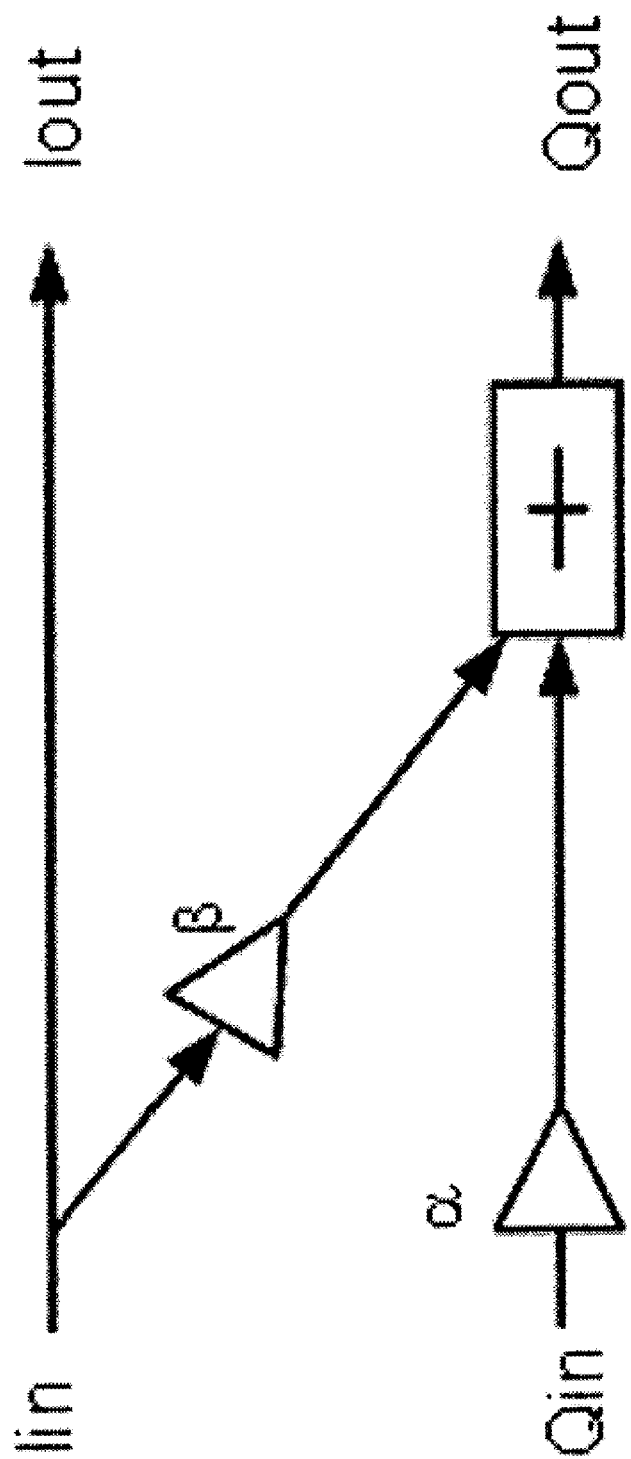
FIG. 8a and FIG. 8b show a mismatch compensating means of the mixer circuit according to the present invention.
Figure 8B:
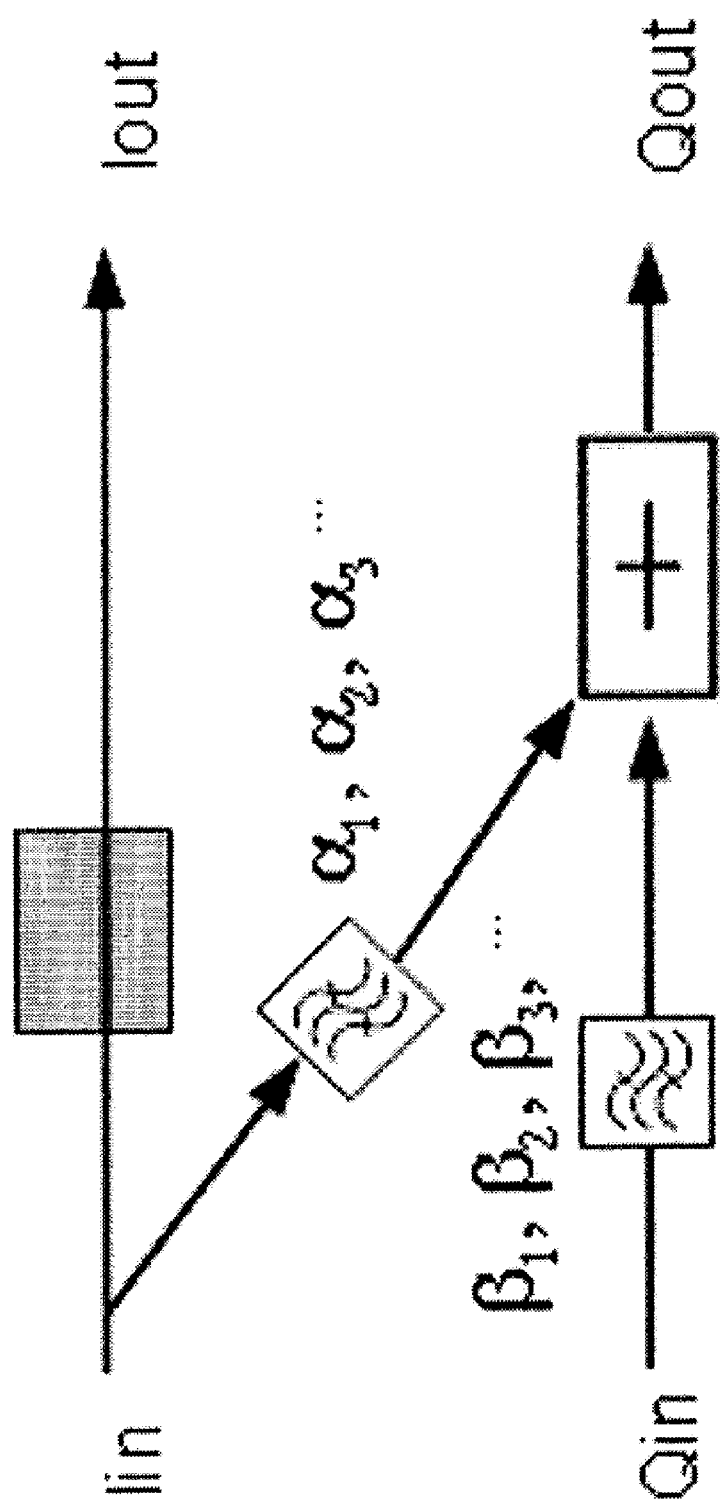

FIG. 8a and FIG. 8b show the mismatch compensating means of the mixer circuit according to the present invention. FIG. 8a shows an embodiment of the mismatch compensating means for a single frequency signal. Moreover FIG. 8b shows an embodiment of the mismatch compensating means for signals comprised in frequency band. According to another embodiment of the present invention, delay generated additively in the quadrature-phase path Q-path by a filter can be prevented with providing an additive filter for phase and gain matching in the in-phase path I-path.

According to FIG. 8a, the input signal Iin is transmitted as the output signal Iout, and a signal generated by adding the input signal Iin multiplied by and input signal Qin multiplied by is transmitted as the output signal Qout.

Although a case of compensating mismatch by using a single image rejection filter is illustrated in above description, gain and phase mismatches in signals comprised in band can be compensated. In other words, it selects frequencies f1, f2, . . . , fN comprised in band, and determines mismatch compensation values about each selected frequencies, respectively. Accordingly, in case of selecting N frequencies, it determines N gain mismatches (A) and N phase mismatches (Ø).

Next, it compensates gain and phase by using estimated gain mismatch and phase mismatch. In case of an embodiment shown in FIG. 8b, the input signal Iin is transmitted as the output signal Iout as it is, and a signal generated by adding the input signal Iin passed a filter and the input signal Qin passed a filter . Preferably, the filter and the filter are filters that have coefficients 1, 1, . . . N and 1, 2, . . . N, about selected frequencies f1, f2, . . . fN, respectively. In this embodiment, the mismatch compensating means is embodied to a digital filter, in digital domain.

According to another embodiment, the mixer circuit estimates the mismatches according to the temperature, and the mismatch compensating means can adjust coefficients of filter according to the temperature. In other words, in case that a mismatch estimation value is different according to the temperature, the mismatch compensating means detects temperature and varies coefficients of the filter on the basis of detected temperature.

Figure 9:
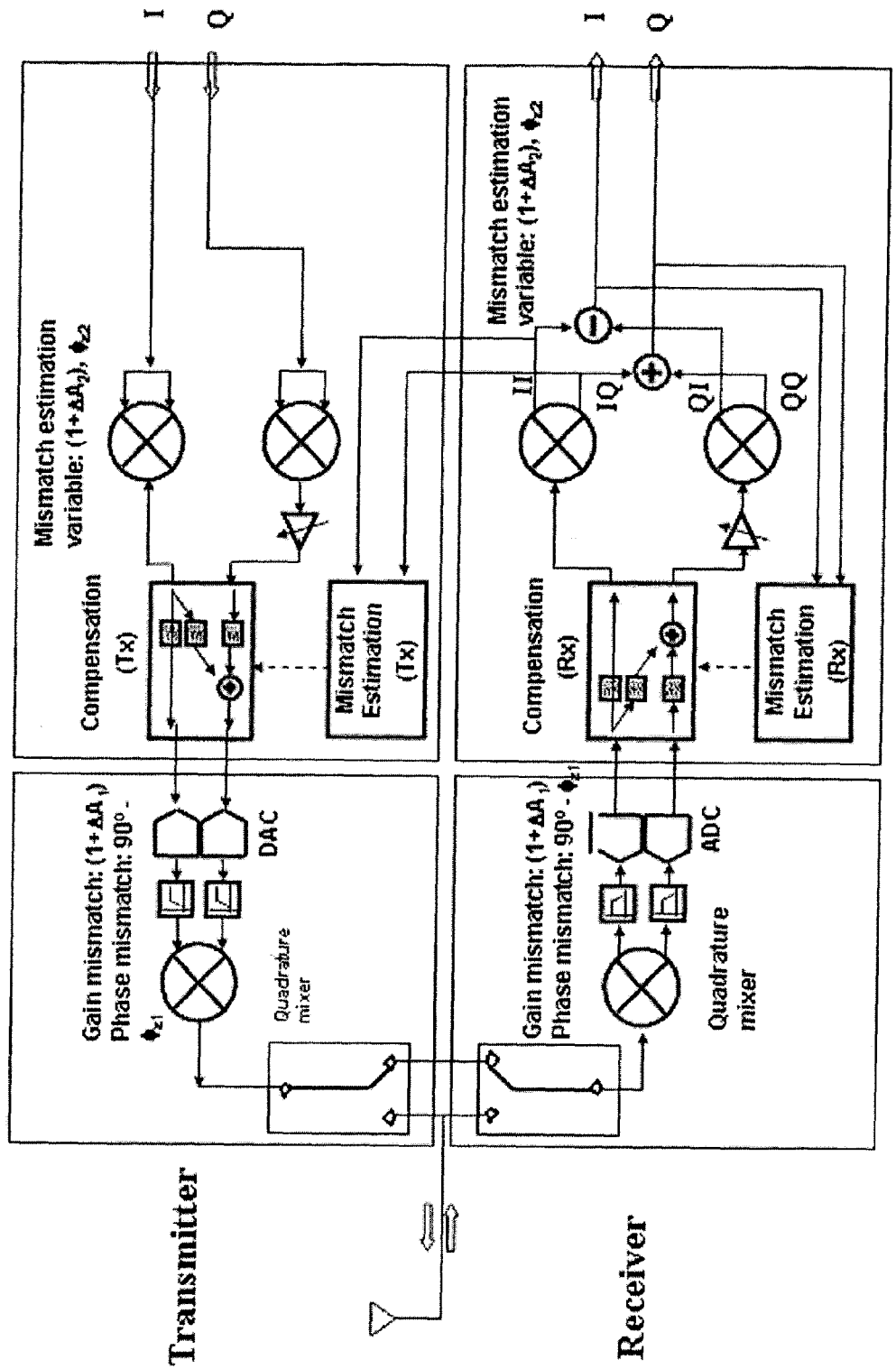
FIG. 9 is a circuit diagram showing a mixer with spurious rejection that is available a receiver, according to another embodiment.

FIG. 9 is a circuit diagram showing a mixer circuit with spurious rejection that is available a receiver, according to another embodiment. The circuit shown in FIG. 9 comprises an up conversion unit that constitutes a transmitter and a down conversion unit for estimating mismatch generated in the up conversion unit by converting an output signal from the up conversion unit to a base-band output signal. The down conversion unit may be embodied by taking a pertinent circuit of a transmitter. As main constitution of the up conversion unit is nearly same with illustration of FIG. 3, in here, specific illustration about it is omitted.

A circuit diagram shown in FIG. 9 is an embodiment of reusing a part of a transmitter for reducing load that is generated by using a transmitter additively. By this, additive down conversion unit is not necessary. In construction of changing operation between transmission and reception by providing a switch to an output terminal, mismatch compensation according to the present invention is performed by making an output signal from the transmitter be inputted to the receiver, during mismatch compensation time. Moreover, according to another embodiment of the present invention, it can estimate mismatch of a transmitter using a circuit of only in-phase path of a receiver. Further, it can perform only mismatch estimation as like above illustration by inputting a sinusoidal signal from a transmitter and converting a receiver to estimating mode.

INDUSTRIAL APPLICABILITY

There is not method for compensating the gain mismatch of mixers and the phase mismatch of local oscillation frequencies in convention circuit. However, according to the present invention, the effect of rejecting spurious is excellent by compensating the gain mismatch of mixer and the phase mismatch of local oscillation frequencies.

Figure 10:
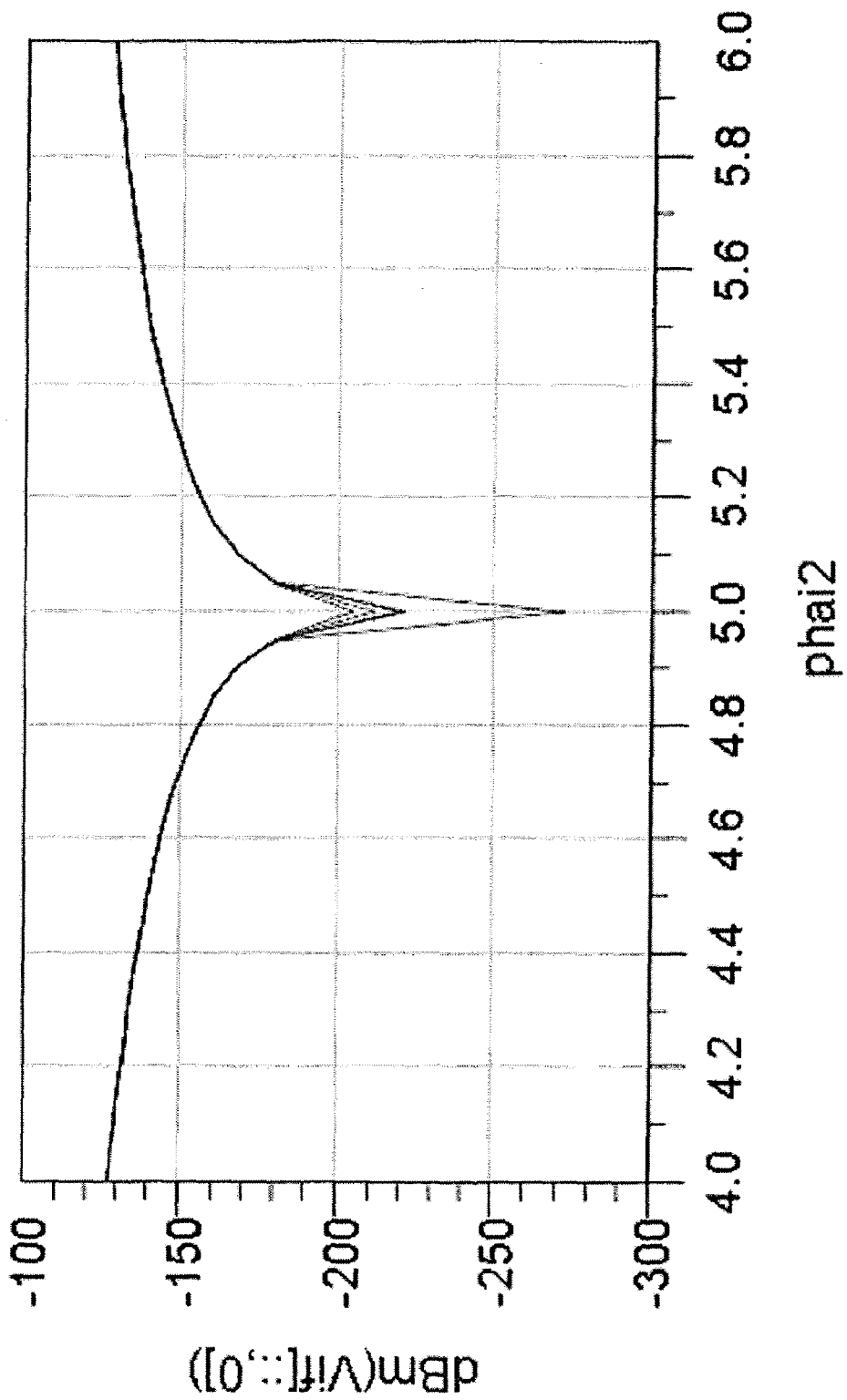
FIG. 10 is a graph of values that are calculated by equation 9 in the mismatch estimating means of the down conversion unit with varying phase compensation value $Ø_{\epsilon^2}$ gradually, according to the present invention.
Figure 11:
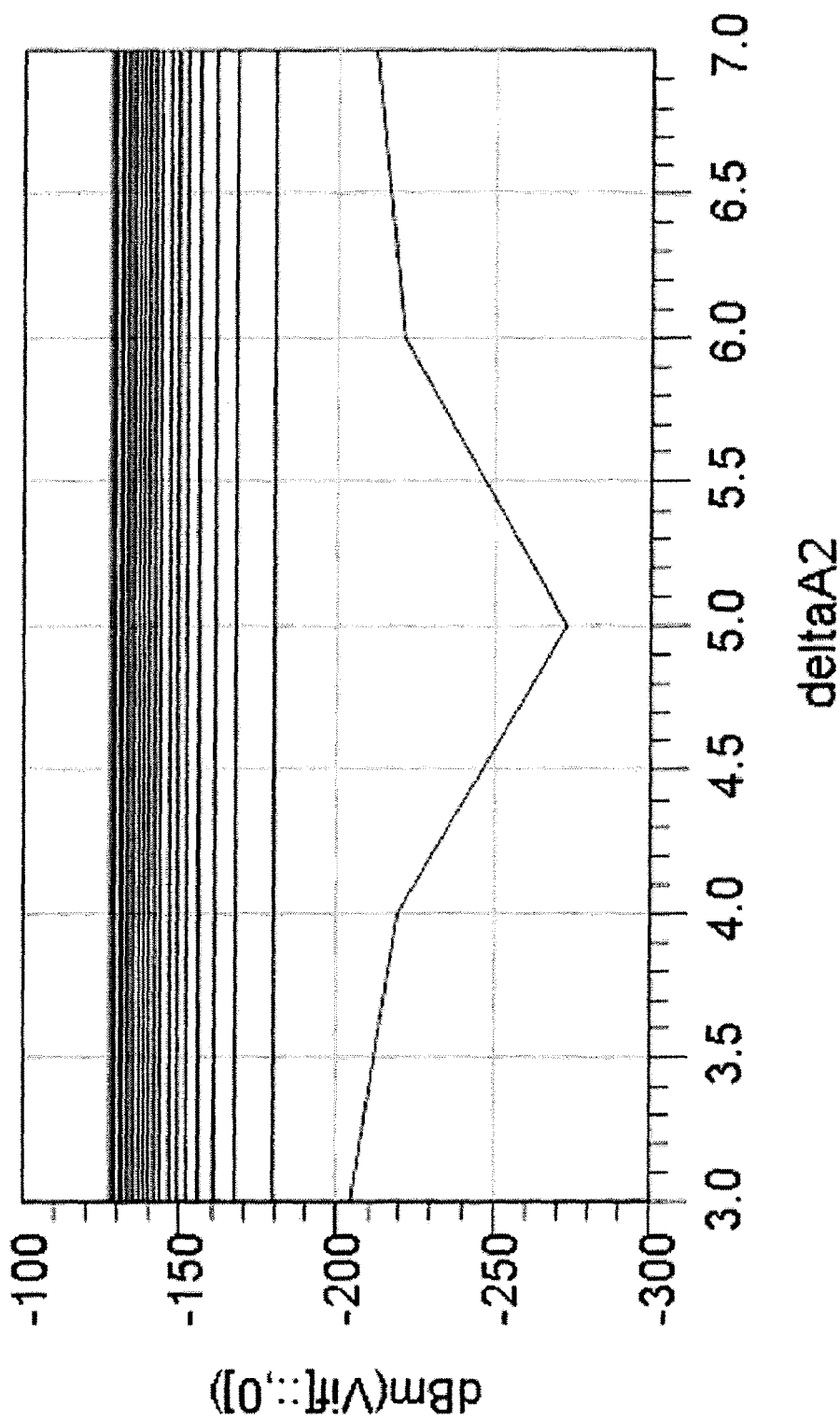
FIG. 11 is a graph of values that are calculated by equation 9 in the mismatch estimating means of the down conversion unit with varying gain compensation value A2 gradually, according to the present invention.

The inventor proves the concept of the present invention experimentally using a logic synthesizer. FIGS. 10 and 11 show a graph of values by equation 9 calculated in the mismatch estimating means of the down conversion unit with varying a phase compensation value $Ø_{e^2}$ and a gain compensation value A2, gradually about a circuit according to the present invention. In FIG. 10, X-axis represents the phase compensation value $Ø_{e^2}$, and Y-axis represents power that is detected the output node of the quadrature mixer of the down conversion unit. In FIG. 11, X-axis represents the gain compensation value A2, and Y-axis represents power that is detected the output node of the quadrature mixer of the down conversion unit.

Figure 12:
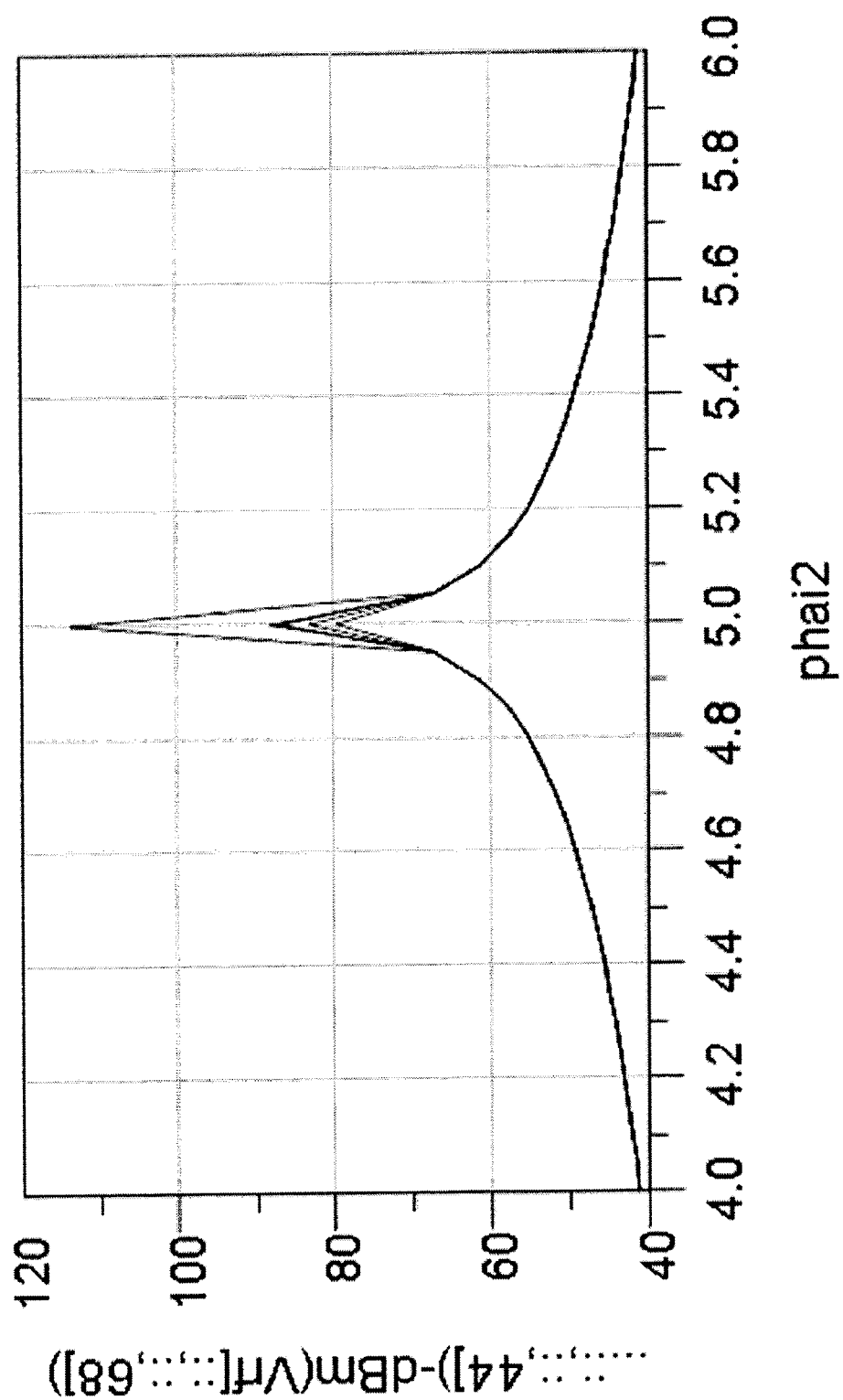
FIG. 12 is a graph for showing effect of spurious rejection to be maximized with varying a phase compensation value $Ø_{\epsilon^2}$ and gain compensation value A2 gradually according to the present invention.

Moreover, FIG. 12 is a graph for showing effect of spurious rejection to be maximized with varying a phase compensation value $Ø_{e^2}$ and gain compensation value A2 gradually according to the present invention. In FIG. 12, X-axis represents the phase compensation value $Ø_{e^2}$, and Y-axis represents power ratio of wanted signal to spurious that is detected the output node of the quadrature mixer of the down conversion unit.

The invention claimed is:

1. A mixer circuit comprising:
   up conversion means for modulating a base-band input signal to an RF signal;
   down conversion means for converting an analog output signal from said up conversion means to a digital base-band output signal, said down conversion means having an analog domain and a digital domain, said analog output signal being converted to a digital signal before being down converted to said digital base-band output signal;
   mismatch estimating means for determining a mismatch compensation value by which a spurious component in an output signal from said down conversion means is minimized, wherein the spurious component results from mismatch in said up conversion means; and
   mismatch compensating means for compensating the mismatch in said up conversion means by using the mismatch compensation value determined by said mismatch estimating means.

2. The mixer circuit of claim 1, wherein
   said up conversion means further comprises
   an up conversion intermediate frequency mixer group for mixing the base-band input signal with a first local signal having an intermediate frequency, and
   an up conversion high frequency mixer group for mixing an output signal from said up conversion intermediate frequency mixer group with a second local signal having a high frequency, and
   said down conversion means further comprises
   a down conversion intermediate frequency mixer group for mixing the output signal from said up conversion means with a third local signal having an intermediate frequency, and
   a down conversion base-band mixer group for mixing an output signal from said down conversion intermediate frequency mixer group with a fourth local signal to generate the base-band output signal.

3. The mixer circuit of claim 2, wherein the base-band input and output signals and the first local signal are digital signals, said up conversion intermediate frequency mixer group is a digital circuit, the second local signal is an analog signal, and said up conversion high frequency mixer group is an analog circuit,
   said up conversion means further comprises a digital to analog converter group for converting the output signal from said up conversion intermediate frequency mixer group to an analog signal,
   said up conversion high frequency mixer group receives the analog signal from said digital to analog converter group to mix the received analog signal with the second local signal,
   the third local signal is an analog signal, said down conversion intermediate frequency mixer group is an analog circuit, the fourth local signal is a digital signal, and said down conversion base-band mixer group is a digital circuit,
   said down conversion unit further comprises an analog to digital converter for converting the output signal from said down conversion intermediate frequency mixer group to a digital signal, and
   said down conversion base-band mixer group receives the digital signal from said analog to digital converter to mix the digital signal with the fourth local signal.

4. The mixer circuit of claim 3, wherein the base-band input signal is a quadrature signal which comprises in-phase and quadrature-phase components,
   said up conversion intermediate frequency mixer group comprises an in-phase mixer subgroup for mixing the in-phase component of the base-band input signal with the first local signal, and a quadrature-phase mixer subgroup for mixing the quadrature-phase component of the base-band input signal with the first local signal,
   said digital to analog converter group comprises in-phase and quadrature-phase converters for converting output signals from said in-phase mixer subgroup and said quadrature-phase mixer subgroup, respectively, to analog signals, and
   said up conversion high frequency mixer group comprises in-phase and quadrature-phase mixers for mixing the analog signals outputted from said in-phase and said quadrature-phase converters with in-phase and quadrature-phase components of the second local signal, respectively.

5. The mixer circuit of claim 4, wherein said in-phase mixer subgroup of said up conversion intermediate frequency mixer group comprises in-phase and quadrature-phase mixers for mixing the in-phase component of the base-band input signal with in-phase and quadrature-phase components of the first local signal, respectively, and adding the mixed signals, and
   said quadrature-phase mixer subgroup of said up conversion intermediate frequency mixer group comprises in-phase and quadrature-phase mixers for mixing the quadrature-phase component of the base-band input signal with in-phase and quadrature-phase components of the first local signal, respectively, and adding the mixed signals, and
   said down conversion base-band mixer group comprises in-phase and quadrature-phase mixers for mixing the digital signal outputted from said analog to digital converter with in-phase and quadrature-phase components of the fourth local signal, and outputting in-phase and quadrature-phase component of the base-band output signal, respectively.

6. A mixer circuit comprising:
   up conversion means for modulating a base-band input signal to an RF signal, the base-band input signal being a quadrature signal having in-phase and quadrature-phase components, said up conversion means including an up conversion intermediate frequency mixer group for mixing the base-band input signal with a first local signal having an intermediate frequency, the base-band input and output signals and the first local signal being digital signals, said up conversion intermediate frequency mixer group being a digital circuit, said up conversion intermediate frequency mixer group having an in-phase mixer subgroup for mixing the in-phase component of the base-band input signal with the first local signal, said in-phase mixer subgroup of said up conversion intermediate frequency mixer group having in-phase and quadrature-phase mixers for mixing the in-phase component of the base-band input signal with in-phase and quadrature-phase components of the first local signal, respectively, and adding the mixed signals, and a quadrature-phase mixer subgroup for mixing the quadrature-phase component of the base-band input signal with the first local signal, an up conversion high frequency mixer group for mixing an output signal from said up conversion intermediate frequency mixer group with a second local signal having a high frequency, the second local signal being an analog signal, and said up conversion high frequency mixer group being an analog circuit, said up conversion high frequency mixer group having in-phase and quadrature-phase mixers for mixing the analog signals outputted from said in-phase and said quadrature-phase converters with in-phase and quadrature-phase components of the second local signal, respectively, said quadrature-phase mixer subgroup of said up conversion intermediate frequency mixer group having in-phase and quadrature-phase mixers for mixing the quadrature-phase component of the base-band input signal with in-phase and quadrature-phase components of the first local signal, respectively, and adding the mixed signals, a digital to analog converter group for converting the output signal from said up conversion intermediate frequency mixer group to an analog signal, said digital to analog converter group having in-phase and quadrature-phase converters for converting output signals from said in-phase mixer subgroup and said quadrature-phase mixer subgroup, respectively, to analog signals, and said up conversion high frequency mixer group being configured to receive the analog signal from said digital to analog converter group to mix the received analog signal with the second local signal;

down conversion means for converting an output signal from said up conversion means to a base-band output signal, said down conversion means including a down conversion intermediate frequency mixer group for mixing the output signal from said up conversion means with a third local signal having an intermediate frequency, the third local signal being an analog signal, said down conversion intermediate frequency mixer group being an analog circuit, and a down conversion base-band mixer group for mixing an output signal from said down conversion intermediate frequency mixer group with a fourth local signal to generate the base-band output signal, the fourth local signal being a digital signal, and said down conversion base-band mixer group being a digital circuit, said down conversion base-band mixer group having in-phase and quadrature-phase mixers for mixing the digital signal outputted from said analog to digital converter with in-phase and quadrature-phase components of the fourth local signal, and outputting in-phase and quadrature-phase component of the base-band output signal, respectively, an analog to digital converter for converting the output signal from said down conversion intermediate frequency mixer group to a digital signal, and said down conversion base-band mixer group being configured to receive the digital signal from said analog to digital converter to mix the digital signal with the fourth local signal;

mismatch estimating means for determining a mismatch compensation value by which a spurious component in an output signal from said down conversion means is minimized, wherein the spurious component results from mismatch in said up conversion means, said mismatch estimating means including means for determining whether a sum of square values of the in-phase and the quadrature-phase components of the base-band output signal is minimized; and mismatch compensating means for compensating the mismatch in said up conversion means by using the mismatch compensation value determined by said mismatch estimating means, said mismatch compensating means including means for making a difference between gains of said in-phase and said quadrature-phase mixer subgroups of said up conversion intermediate frequency mixer group to be a predetermined value, and varying the difference gradually, and means for recording the difference which occurs when said means for determining whether the sum of square values of the in-phase and the quadrature-phase components of the base-band output signal is minimized determines that the sum of square values of the in-phase and the quadrature-phase components of the base-band output signal is minimized, and determining the recorded difference to be the mismatch compensation value.

7. A mixer circuit comprising:

up conversion means for modulating a base-band input signal to an RE signal, the base-band input signal being a quadrature signal having in-phase and quadrature-phase components, said up conversion means including an up conversion intermediate frequency mixer group for mixing the base-band input signal with a first local signal having an intermediate frequency, the base-band input and output signals and the first local signal being digital signals, said up conversion intermediate frequency mixer group being a digital circuit, said up conversion intermediate frequency mixer group having an in-phase mixer subgroup for mixing the in-phase component of the base-band input signal with the first local signal, said in-phase mixer subgroup of said up conversion intermediate frequency mixer group having in-phase and quadrature-phase mixers for mixing the in-phase component of the base-band input signal with in-phase and quadrature-phase components of the first local signal, respectively, and adding the mixed signals, and a quadrature-phase mixer subgroup for mixing the quadrature-phase component of the base-band input signal with the first local signal, an up conversion high frequency mixer group for mixing an output signal from said up conversion intermediate frequency mixer group with a second local signal having a high frequency, the second local signal being an analog signal, and said up conversion high frequency mixer group being an analog circuit, said up conversion high frequency mixer group having in-phase and quadrature-phase mixers for mixing the analog signals outputted from said in-phase and said quadrature-phase converters with in-phase and quadrature-phase components of the second local signal, respectively, said quadrature-phase mixer subgroup of said up conversion intermediate frequency mixer group having in-phase and quadrature-phase mixers for mixing the quadrature-phase component of the base-band input signal with in-phase and quadrature-phase components of the first local signal, respectively, and adding the mixed signals, a digital to analog converter group for converting the output signal from said up conversion intermediate frequency mixer group to an analog signal, said digital to analog converter group having in-phase and quadrature-phase converters for converting output signals from said in-phase mixer subgroup and said quadrature-phase mixer subgroup, respectively, to analog signals, and said up conversion high frequency mixer group being configured to receive the analog signal from said digital to analog converter group to mix the received analog signal with the second local signal;

down conversion means for converting an output signal from said up conversion means to a base-band output signal, said down conversion means including a down conversion intermediate frequency mixer group for mixing the output signal from said up conversion means with a third local signal having an intermediate frequency, the third local signal being an analog signal, said down conversion intermediate frequency mixer group being an analog circuit, and a down conversion base-band mixer group for mixing an output signal from said down conversion intermediate frequency mixer group with a fourth local signal to generate the base-band output signal, the fourth local signal being a digital signal, and said down conversion base-band mixer group being a digital circuit, said down conversion base-band mixer group having in-phase and quadrature-phase mixers for mixing the digital signal outputted from said analog to digital converter with in-phase and quadrature-phase components of the fourth local signal, and outputting in-phase and quadrature-phase component of the base-band output signal, respectively, an analog to digital converter for converting the output signal from said down conversion intermediate frequency mixer group to a digital signal, and said down conversion base-band mixer group being configured to receive the digital signal from said analog to digital converter to mix the digital signal with the fourth local signal;

mismatch estimating means for determining a mismatch compensation value by which a spurious component in an output signal from said down conversion means is minimized, wherein the spurious component results from mismatch in said up conversion means, said mismatch estimating means including means for determining whether a sum of square values of the in-phase and the quadrature-phase components of the base-band output signal is minimized; and mismatch compensating means for compensating the mismatch in said up conversion means by using the mismatch compensation value determined by said mismatch estimating means, said mismatch compensating means including means for making a difference between phases of the in-phase and the quadrature-phase components of the first local signal which are applied respectively to said in-phase and said quadrature-phase mixers of said in-phase mixer subgroup of the up conversion intermediate frequency mixer group to be a predetermined value which is larger than 90 degree and varying the difference gradually, and means for recording the difference which occurs when said means for determining whether sum of square values of the in-phase and the quadrature-phase components of the base-band output signal is minimized, and determining the recorded difference to be the mismatch compensation value.

* * * * *